US010381976B2

(12) United States Patent
Ben-Al-Lal et al.

(10) Patent No.: US 10,381,976 B2
(45) Date of Patent: Aug. 13, 2019

(54) SOLAR PANEL SYSTEM AND METHOD FOR ACCELERATED REGENERATION AND/OR PREVENTION OF DEFECTS IN SOLAR PANELS

(71) Applicant: FUTECH, Tessenderlo (BE)

(72) Inventors: Ismaël Ben-Al-Lal, Zoutleeuw (BE); Pieter Vangeel, Ham (BE)

(73) Assignee: FUTECH, Tessenderlo (BE)

( * ) Notice: Subject to any disclaimer, the term of this patent is extended or adjusted under 35 U.S.C. 154(b) by 0 days.

(21) Appl. No.: 15/308,487

(22) PCT Filed: May 4, 2015

(86) PCT No.: PCT/EP2015/059665
§ 371 (c)(1),
(2) Date: Nov. 2, 2016

(87) PCT Pub. No.: WO2015/166108
PCT Pub. Date: Nov. 5, 2015

(65) Prior Publication Data
US 2017/0111008 A1 Apr. 20, 2017

(30) Foreign Application Priority Data
May 2, 2014 (BE) .................................. 2014/0306

(51) Int. Cl.
*H02S 40/34* (2014.01)
*H02S 50/00* (2014.01)
(Continued)

(52) U.S. Cl.
CPC ............ *H02S 40/34* (2014.12); *H01L 31/048* (2013.01); *H02S 30/10* (2014.12); *H02S 40/30* (2014.12); *H02S 50/00* (2013.01); *H02S 50/10* (2014.12)

(58) Field of Classification Search
CPC ....... H01L 31/048; H02S 30/10; H02S 40/10; H02S 40/12; H02S 40/30; H02S 40/34; H02S 50/00; H02S 50/10
See application file for complete search history.

(56) References Cited

U.S. PATENT DOCUMENTS 3,813,519 A * 5/1974 Jochim .................. B41F 15/08
101/126
5,071,491 A * 12/1991 Stein ................. H01L 31/02008
136/244
(Continued)

FOREIGN PATENT DOCUMENTS

BE 1020776 A5 4/2014
CN 102263156 A 11/2011
(Continued)

OTHER PUBLICATIONS

English machine translation of EP 1427024 A2.*
(Continued)

*Primary Examiner* — Lindsey A Bernier
(74) *Attorney, Agent, or Firm* — Workman Nydegger

(57) ABSTRACT

The present invention provides a solar panel installation, comprising at least one solar panel comprising photovoltaic cells, and a translucent plate on the upper side, wherein the translucent plate is provided with an electrically conductive layer that is provided in order to have an electric potential applied to it and which is electrically isolated from the photovoltaic cells, such that an electric potential applied to the electrically conductive layer will be uniformly distributed over the upper side of the at least one solar panel. In addition, the invention provides a method for applying the electrically conductive layer and for regenerating and/or preventing defects in the at least one solar panel.

13 Claims, 2 Drawing Sheets

(51) Int. Cl.
*H02S 50/10* (2014.01)
*H02S 30/10* (2014.01)
*H02S 40/30* (2014.01)
*H01L 31/048* (2014.01)

(56) References Cited

U.S. PATENT DOCUMENTS

| | | | |
|---|---|---|---|
| 9,496,424 B2 | 11/2016 | Nagel | |
| 2011/0308574 A1* | 12/2011 | Vaidyanathan | H01L 31/0504 136/246 |
| 2012/0180851 A1 | 7/2012 | Nagel | |
| 2013/0263393 A1* | 10/2013 | Mazumder | A47L 13/40 15/1.51 |
| 2016/0134232 A1 | 5/2016 | Ben-Al-Lal et al. | |

FOREIGN PATENT DOCUMENTS

| | | | | |
|---|---|---|---|---|
| CN | 102498573 A | 6/2012 | | |
| CN | 103762277 A | 4/2014 | | |
| EP | 1427024 A2 * | 6/2004 | | C03C 17/06 |
| JP | 2013258310 A | 12/2013 | | |
| WO | 2009073501 A2 | 6/2009 | | |
| WO | 2011045434 A2 | 4/2011 | | |
| WO | WO-2012078765 A2 * | 6/2012 | | A47L 13/40 |
| WO | 2013135349 A1 | 9/2013 | | |

OTHER PUBLICATIONS

Chinese Office Action from CN Application No. CN 201580020345.6, dated Feb. 6, 2018.
Chinese Search Report from CN Application No. CN 201580020345.6, dated Jan. 10, 2018.
Belgium Search Report for corresponding Belgium Application No. 2014/0306, dated Jan. 28, 2015.
International Search Report for corresponding International PCT Application No. PCT/EP2015/059665, dated Jul. 31, 2015.

* cited by examiner

SOLAR PANEL SYSTEM AND METHOD FOR ACCELERATED REGENERATION AND/OR PREVENTION OF DEFECTS IN SOLAR PANELS

FIELD OF THE INVENTION

The present invention relates to the solar energy sector and more specifically to solar panel systems with solar panels containing photovoltaic technology, such as for example photovoltaic cells. The present invention can be used for preventing and/or reducing the degradation of solar panels in solar panel systems, and thereby also for improving the efficiency of such solar panel systems and for maintaining their level of efficiency over the course of time.

BACKGROUND OF THE INVENTION

Existing solar panel systems based on photovoltaic technology are subject to degradation in performance over the course of time. This degradation means that the efficiency and thus the energy yields of the solar panel systems decrease over time. There can be a variety of reasons for the degradation of solar panels such as physical damage, hot spots, snail trails, mismatches, delamination, back currents, potential induced degradation (PID) and other defects that accelerate the degradation of solar panels. Such defects occur in at least 75% of the solar panel systems and are therefore widespread.

There are methods for regenerating and/or preventing such defects in solar panels, which are caused or worsened by potential differences. These methods involve using a voltage source to build up a potential difference or voltage between each solar panel or photovoltaic cell of the solar panel system and the supporting structure wherein the solar panel is assembled. This may involve connecting the first terminal of the voltage source to the negative terminal, the positive terminal or both terminals of the solar panel. The supporting structure can then be connected to the second terminal of the voltage source, or the supporting structure may be earthed, thereby making the electrical potential of the supporting structure equal to the ground potential. A method such as this is described inter alia in BE1020776A5.

The invention described in BE1020776A5 works correctly, but experience has shown that the method for regenerating and/or preventing defects in solar panels sometimes has to be applied for a long time.

SUMMARY OF THE INVENTION

One aim of the present invention is to provide a solar panel system and a method in which defects caused or exacerbated by potentials can be regenerated and/or prevented at an accelerated rate across the entire surface of the solar panels and therefore can be done in a shorter time.

To this end, the invention provides a solar panel installation, comprising at least one solar panel comprising at least one photovoltaic cell or preferably a plurality of electrically connected photovoltaic cells, wherein the at least one solar panel comprises a translucent plate on the upper side of the at least one solar panel and protects the at least one photovoltaic cell from its surroundings, wherein the translucent plate of the at least one solar panel is provided with an electrically conductive layer arranged to have an electric potential applied to it and which is electrically isolated from the at least one photovoltaic cell, such that an electric potential applied to the electrically conductive layer is uniformly distributed over the upper side of the at least one solar panel.

The electrically conductive layer that is provided on the translucent plate has the advantage that an electrical potential can be applied to the electrically conductive layer when carrying out the method for regenerating and/or preventing defects in the solar panels instead of applying it to a supporting structure that the at least one solar panel is fitted in. When doing so, the electrical potential applied is uniformly distributed across the upper side of the at least one solar panel, as opposed to an electrical potential applied to a supporting structure that will then only be localised at the edges of the at least one solar panel that is in the immediate vicinity of the said supporting structure. The experience of the inventors is that the regeneration and/or prevention of defects in solar panels can hereby be improved, because the regeneration and/or prevention of defects can be performed at the same rate across the entire surface of the at least one solar panel.

The electrically conductive layer also offers the benefit that a method for the regeneration and/or prevention of defects in solar panels can also be applied to solar panel systems that do not have supporting structures or where the supporting structures are less suitable for applying a potential to.

The electrically conductive layer can for example be provided such that an electrical potential can be applied via at least one connector for an electrical connection with a means for supplying an electrical potential, such as a voltage source or the earth. Another possibility is to provide the electrically conductive layer such that it is electrically connected to an electrically conductive supporting structure in which the at least one solar panel is mounted, wherein the said supporting structure is provided such that an electrical potential can be applied to it, for example via a connector for an electrical connection to a means for supplying the electrical potential. It should therefore be clear that there are various ways of providing the electrically conductive layer such that an electrical potential can be applied to it.

In one embodiment of the solar panel system according to the present invention, the solar panel system further comprises at least one electrically conductive supporting structure wherein the at least one solar panel has been mounted and the electrically conductive layer is connected electrically to the at least one supporting structure such that an electric potential can be applied to the electrically conductive layer by applying an electric potential to the at least one supporting structure.

The electrically conductive layer that is connected up electrically to the at least one supporting structure has the advantage that no modifications have to be made to an existing solar panel system that already has a means for applying and electric potential to its at least one supporting structure, beyond the fact that the translucent plate has to be provided with the electrically conductive layer that is electrically connected to the at least one supporting structure. There is therefore no requirement for existing electrical connections for applying an electric potential to the at least one supporting structure to be relocated from the at least one supporting structure to the electrically conductive layer instead. The electric potential applied to the at least one supporting structure will after all be transferred by the electrical connection between the electrically conductive layer and the at least one supporting structure to the said electrically conductive layer, and this will distribute the electric potential applied to the at least one supporting structure uniformly over the upper side of the at least one solar panel.

The electrical connection between the electrically conductive layer and the at least one supporting structure can for example be applied by allowing the electrically conductive layer to extend at least in part onto the at least one supporting structure. Another possibility is to provide electrical connectors or contacts through which the electrical connection can be made. It should therefore be clear that there are various ways of making the electrical connection between the electrically conductive layer and the at least one supporting structure.

In one embodiment of the solar panel system according to the present invention, the electrically conductive layer is incorporated into the translucent plate.

An electrically conductive layer that is included as part of the translucent plate has the advantage that the translucent plate itself acts as a protective casing for the electrically conductive layer. This reduces the chance of damage occurring to the electrically conductive layer. Such damage to the electrically conductive layer may after all cause an electric potential that is applied to the electrically conductive layer not to be uniformly distributed over the upper side of the at least one solar panel of the solar panel system, as a result of which regeneration and/or prevention of defects will not take place equally quickly at all points on the at least one solar panel.

The electrically conductive layer may be integrated into the translucent plate for example by placing the electrically conductive layer between a first layer of the translucent plate and a second layer of the translucent plate. The electrically conductive layer may also be integrated by letting a liquid material cure or harden to shape the translucent plate around the electrically conductive layer. It should therefore be clear that there are various ways to integrate the electrically conductive layer into the translucent plate.

In one embodiment of the solar panel system according to the present invention, the electrically conductive layer is applied on top of the translucent plate.

An electrically conductive layer on top of the translucent plate has the advantage that the electrically conductive layer can also be applied simply to the solar panels in existing solar panel systems that already have a translucent plate without an electrically conductive layer.

The electrically conductive layer on top of the translucent plate is also easily accessible for inspection, maintenance and repairs. If any areas of damages occur in the electrically conductive layer, the damage can be repaired easily and quickly, for example by replacing the damaged part of the electrically conductive layer, or by replacing the entire electrically conductive layer.

Furthermore, having the electrically conductive layer on top of the translucent plate has the advantage that the electrically conductive layer can be removed easily, if this capability is required for the electrically conductive layer, and if removing the electrically conductive layer is required. This may be the case after the defects in the at least one solar panel of the solar panel system have been sufficiently regenerated and/or treated preventively, after which the electrically conductive layer can be reused in other solar panel systems.

In one embodiment of the solar panel system according to the present invention, the electrically conductive layer is applied on top of the translucent plate in a manner that allows it to be removed.

Removing the electrically conductive layer has the advantage that the translucent plate of the at least one solar panel only has the electrically conductive layer when carrying out a method for the regeneration and/or prevention of defects, wherein an electric potential is applied to the electrically conductive layer. As a result, the electrically conductive layer cannot hinder the functioning of the at least one solar panel if a method for the regeneration and/or prevention of defects is not carried out, i.e. during the normal operation of generating electric current. The advantage is therefore that permanent alterations to existing solar panel systems are not required. Another advantage is that the electrically conductive layer does not then necessarily have to be transparent or translucent.

The possibility of removing the electrically conductive layer also has the advantage that the electrically conductive layer can be reused in other solar panel systems.

In one embodiment of the solar panel system according to the present invention, the translucent plate is given an electrically conductive layer by spraying an electrically conductive liquid material onto a surface of the translucent plate.

The inventors' experience is that the translucent plate can be given an electrically conductive layer quickly and simply by nebulizing, atomizing or spraying on an electrically conductive liquid material.

This also has the advantage that the electrical connection between the electrically conductive layer and the at least one supporting structure, where present, can be provided easily by also spraying the electrically conductive liquid material partly onto parts of the at least one supporting structure that are connected to the translucent plate.

Furthermore, the electrically conductive layer that is provided for the translucent plate in this way also has the advantage that the electrically conductive layer can be repaired easily and quickly in the event of any damage to it. To do so, it is then sufficient to nebulize or spray an additional amount of the electrically conductive liquid material onto the damaged area in the electrically conductive layer.

The electrically conductive liquid material can for example be a material that is electrically conductive and in liquid form, or it could also e.g. be an electrically conductive material in solid form that has been integrated into a liquid. It should therefore be clear that there are various ways of applying the electrically conductive liquid material.

Spraying an electrically conductive liquid material onto a surface of the translucent plate makes it possible to give this plate a film or a coating comprising at least in part an electrically conductive liquid material. However, this method also makes it possible to provide the translucent plate with a grid of electrical conductors, wherein these electrical conductors are applied by spraying an electrically conductive liquid material to the translucent plate, for example in a printing process.

In one embodiment of the solar panel system according to the present invention, the liquid electrically conductive material is designed to harden or cure after being sprayed onto a surface of the translucent plate, e.g. by UV light.

In one embodiment of the solar panel system according to the present invention, the electrically conductive liquid material is designed to adhere to the surface of the translucent plate while the material is still in its liquid form.

This has the advantage that the electrically conductive layer, after having been used in a method for the regeneration and/or prevention of defects in the at least one solar panel, can be brushed away or rinsed off easily in order to restore the at least one solar panel to its original state.

The electrically conductive liquid material may be made to adhere to the surface of the translucent plate as a result of adhesion between the liquid electrically conductive material and the material of the translucent plate. However, adhesion can also be effected by including an adhesive agent such as a glue in the electrically conductive liquid material. It should therefore be clear that there are various ways making the electrically conductive liquid material adhere to the translucent plate.

In one embodiment of the solar panel system according to the present invention, the electrically conductive layer comprises a film at least partially comprising an electrically conductive material.

The inventors' experience is that a film at least partially comprising an electrically conductive material is highly suitable for uniform distributing an electric potential that is applied to the electrically conductive layer over the upper side of the at least one solar panel. The film comprising at least partially an electrically conductive material can after all very easily cover a surface of the translucent plate, or indeed cover the entire surface.

It should be clear here too that there are various ways to make a film that at least partially comprises an electrically conductive material adhere to the translucent plate, such as by adhesion using an adhesive agent, or by stretching the film over the translucent plate.

In one embodiment of the solar panel system according to the present invention, the electrically conductive layer comprises a grid of electrical conductors.

In the inventors' experience, the grid of electrical conductors can give the translucent plate an electrically conductive layer, using only a limited amount of material. This is because the electrically conductive layer may comprise a plurality of electrical conductors that are spread out over a surface of the translucent plate. This can be sufficient for achieving uniform distribution of an electric potential that is applied to the electrically conductive layer.

In one embodiment of the solar panel system according to the present invention, the electrically conductive layer is transparent to light.

The electrically conductive layer is preferably created such that the electrically conductive layer prevents the operation of the at least one solar panel for converting light into electricity as little as possible, and that the efficiency of the at least one solar panel is therefore not affected by the electrically conductive layer. Using a transparent electrically conductive layer is very advantageous, as this will allow the greatest proportion of the incident light hitting the electrically conductive layer to pass through to the at least one photovoltaic cell of the at least one solar panel.

In one embodiment of the solar panel system according to the present invention, the translucent plate comprises glass.

Many types of solar panel use a glass plate as a translucent plate. This material has good translucency properties and provides appropriate protection on the upper side of the at least one solar panel. Glass is also a suitable material for applying an electrically conductive layer on.

In one embodiment of the solar panel system according to the present invention, the solar panel system comprises an apparatus for regenerating and/or preventing defects in the at least one solar panel of the solar panel system, wherein the apparatus comprises:
  at least one voltage source for applying a predefined voltage (the regeneration voltage) between the at least one solar panel and the electrically conductive layer or, where present, the at least one supporting structure,
  a switching circuit for making or breaking an electrical connection between a first terminal of the at least one voltage source and the electrically conductive layer or the at least one supporting structure, where present, and
  a switching circuit for making or breaking an electrical connection between a second terminal of the at least one voltage source and at least one of the negative and positive terminals of the at least one solar panel.

The various embodiments of the apparatus in the at least one solar panel are described in Belgian patent BE1020776A5, which has been included herein as a reference document. It should be clear to those skilled in the art that the apparatus for regenerating and/or preventing defects in solar panels as described in BE1020776A5 can be used mutatis mutandis in the solar panel system according to one embodiment of the present invention for applying the regeneration voltage between the electrically conductive layer and the at least one solar panel, instead of between the at least one supporting structure and the at least one solar panel.

In one embodiment of the solar panel system according to the present invention, the apparatus comprises at least one power meter to determine the power drawn by the at least one solar panel from the at least one voltage source, the said at least one meter being connected to and placed between the at least one solar panel and the at least one voltage source.

In one embodiment of the solar panel system according to the present invention, the solar panel system also comprises an electrical connection between the at least one solar panel and the mains electricity, and the apparatus also comprises a switching circuit for making and breaking an electrical connection between the terminals of the at least one solar panel on the one hand and the mains electricity on the other.

In one embodiment of the solar panel system according to the present invention, the apparatus also comprises at least one control unit to control the apparatus, the said control unit being connected to the at least one voltage source and the switching circuits for making and breaking the electrical connections.

In one embodiment of the solar panel system according to the present invention, the at least one control unit is connected to the at least one power meter.

In one embodiment of the solar panel system according to the present invention, the purpose of the apparatus is also the detection of defects in the at least one solar panel of the solar panel system.

The present invention also provides a method for applying the electrically conductive layer to a solar panel system, wherein the solar panel system comprises at least one solar panel containing at least one photovoltaic cell or preferably a plurality of electrically connected photovoltaic cells, and wherein the at least one solar panel comprises a translucent plate on the upper side of the at least one solar panel that protects the at least one photovoltaic cell from its surroundings, and wherein the method comprises the step of providing the translucent plate on the at least one solar panel with an electrically conductive layer that is provided in order to have an electric potential applied to it, such that an electric potential applied to the electrically conductive layer will be uniformly distributed over the upper side of the at least one solar panel.

In the inventors' experience, the method of the present invention is highly advantageous for providing a solar panel system wherein the defects in the at least one solar panel can be regenerated more quickly and/or prevented using a method for the regeneration and/or prevention of defects in a solar panel system that involves applying an electric potential to the electrically conductive layer of the at least one solar panel of the solar panel system. The advantages of the various embodiments of the method for applying the electrically conductive layer have already been discussed above in relation to the various embodiments of the solar panel system according to the present invention.

In one embodiment of the method according to the present invention, wherein the solar panel system also comprises at least one electrically conductive supporting structure wherein the at least one solar panel is mounted, the electrically conductive layer is applied in such a way that it is electrically connected to the at least one supporting structure.

In one embodiment of the method according to the present invention, the electrically conductive layer is also applied to part of the at least one supporting structure that is connected to the translucent plate, such that the electrically conductive layer is electrically connected to the at least one supporting structure.

In one embodiment of the method according to the present invention, the step of applying the electrically conductive layer comprises spraying an electrically conductive liquid material onto the translucent plate and optionally onto the at least one supporting structure, where present.

In one embodiment of the method according to the present invention, the step of applying the electrically conductive layer comprises applying a film comprising at least partially an electrically conductive material onto the translucent plate and optionally onto the at least one supporting structure, where present.

In one embodiment of the method according to the present invention, the step of applying the electrically conductive layer comprises applying a grid of electrical conductors onto the translucent plate and optionally onto the at least one supporting structure, where present.

In one embodiment of the method according to the present invention, the method is for regenerating and/or preventing defects in the at least one solar panel of the solar panel system by applying an electric potential to at least one element from the group of a negative terminal of the at least one solar panel, a positive terminal of the at least one solar panel, the electrically conductive layer and the at least one supporting structure, where present.

In one embodiment of the method according to the present invention, the method is for regenerating and/or preventing defects in the at least one solar panel of the solar panel system by applying an electric potential to at least one element chosen from the group that comprises a negative terminal of the at least one solar panel, a positive terminal of the at least one solar panel, the electrically conductive layer and the at least one supporting structure, where present.

In one embodiment of the method according to the present invention, the method is for regenerating and/or preventing defects in the at least one solar panel of the solar panel system and comprises the steps below:

(a) creating an electrical connection between the electrically conductive layer or, where present, the at least one supporting structure, and the first terminal of the at least one voltage source.

(b) creating an electrical connection between a second terminal of the at least one voltage source and at least one of the negative terminals and positive terminals of the at least one solar panel, and preferably both terminals.

(c) applying a predefined voltage (the regeneration voltage) between the at least one solar panel and the electrically conductive layer, where present, the at least one supporting structure using the at least one voltage source, and keeping the regeneration voltage applied for a predefined period of time (the regeneration time), (d) removing the electrical connection between the at least one voltage source and the at least one solar panel after the regeneration time, and removing the electrical connection between the at least one voltage source and the electrically conductive layer or, where present, the at least one supporting structure.

The various embodiments of the method for regenerating and/or preventing defects in the at least one solar panel is also described in Belgian patent BE1020776A5, whereby it should also be clear to those skilled in the art that the method for regenerating and/or preventing defects in solar panels as described in BE1020776A5 can be used mutatis mutandis in the method according to one embodiment of the present invention for applying the regeneration voltage between the electrically conductive layer and the at least one solar panel, instead of between the at least one supporting structure and the at least one solar panel.

In one embodiment of the method according to the present invention, step (c) also comprises measuring the power that is drawn from the at least one voltage source by the at least one solar panel.

In one embodiment of the method according to the present invention, the method between step (c) and step (d) also comprises a step (c') involving adjustment of the regeneration voltage and/or regeneration time based on the power measured in step (c).

In one embodiment of the method according to the present invention, step (c') also involves measuring the power drawn from the at least one voltage source by the at least one solar panel.

In one embodiment of the method according to the present invention, the regeneration voltage is an alternating voltage.

In one embodiment of the method according to the present invention, the regeneration voltage is a direct voltage.

In one embodiment of the method according to the present invention for a solar panel system that also comprises an electrical connection between the at least one solar panel and the electricity mains, the method between step (a) and step (b) also comprises a step (a') for removing the electrical connection between the at least one solar panel and the mains electricity, and also electrically reconnecting the at least one solar panel to the mains electricity.

In one embodiment of the method according to the present invention, step (a') also comprises checking whether the electrical connection between the at least one solar panel and the mains electricity has really been disconnected.

In one embodiment of the method according to the present invention for a solar panel system that also comprises at least one converter, the said at least one converter has been placed between the at least one solar panel and the mains electricity and is connected electrically to both, with the at least one converter converting the direct voltage from the at least one solar panel into an alternating voltage suitable for supplying to the mains electricity, the electrical connection between the at least one solar panel and the electricity mains is interrupted before the converter in step (b) of the method.

In one embodiment of the method according to the present invention, steps (a) to (d) of the method are carried out during the night-time.

In one embodiment of the method according to the present invention, steps (a) to (d) of the method are repeated at regular intervals.

In one embodiment of the method according to the present invention, the method is also for detecting defects in the solar panels of a solar panel system.

In one embodiment of the method according to the present invention, the method also comprises the step of removing the electrically conducted layer from the translucent plate and the at least one supporting structure (where present) after the other steps have been carried out, where the electrically conductive layer is removable.

BRIEF DESCRIPTION OF THE DRAWINGS

The invention shall be explained in detail below using the following description and the enclosed figures.

DETAILED DESCRIPTION OF EMBODIMENT(S)

Figure 1:
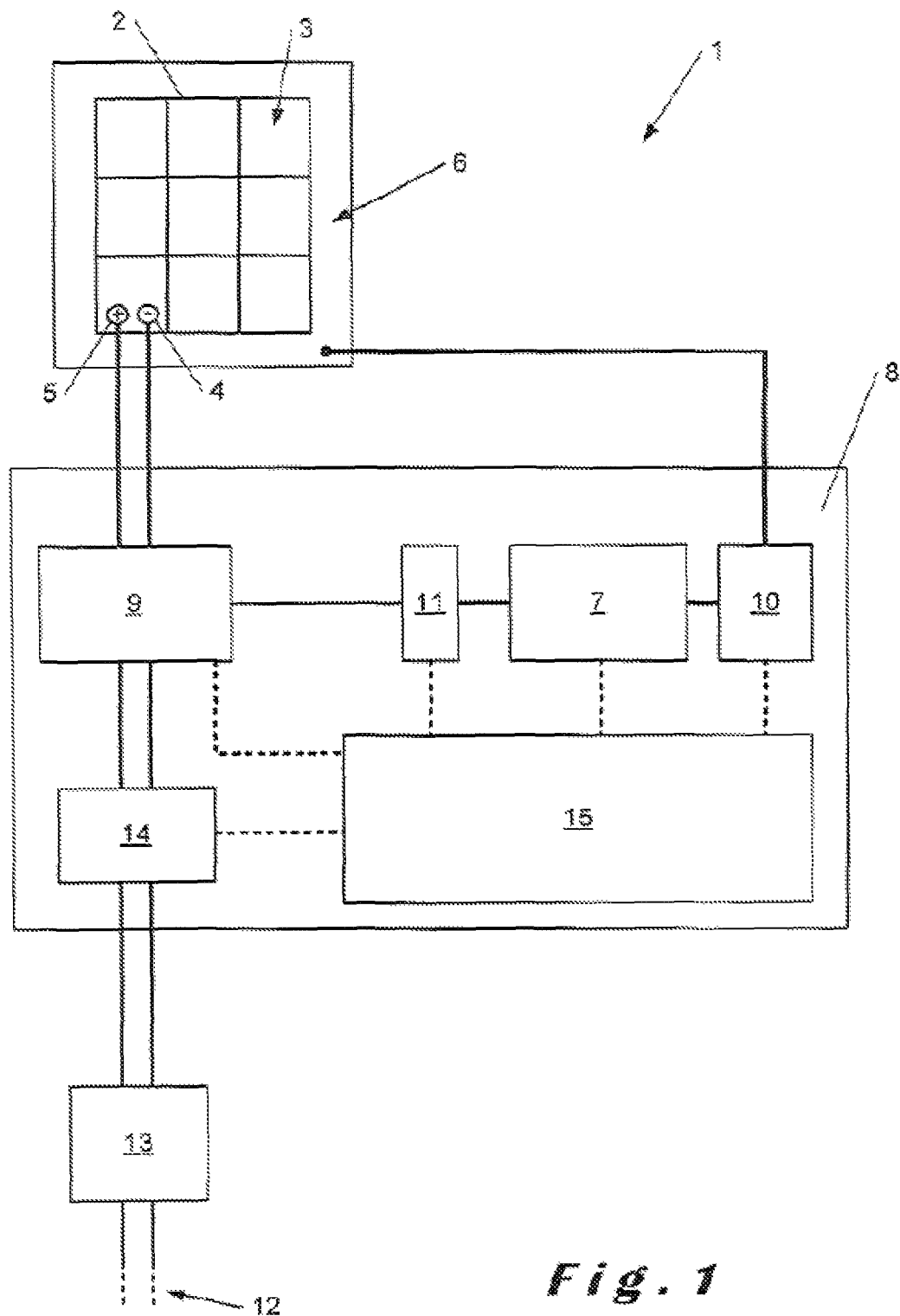
FIG. 1 shows a schematic representation of a solar panel system according to one embodiment of the present invention.

The present invention will be described below using certain defined embodiments and with references to specific drawings, although the invention is not restricted by them and is only defined by the claims. The drawings shown here are purely schematic representations and are not limitative. The dimensions of certain components may have been shown at a magnified scale in the drawings, which means that the parts in question are therefore not to scale; this has been done for purposes of illustration only. The absolute and relative dimensions do not necessarily reflect the actual practical embodiments of the invention.

Moreover, terms such as 'first', 'second', 'third' and so forth in the description and in the claims have been used to make a distinction between identical elements and do not necessarily represent a sequential or chronological order. The terms in question are mutually interchangeable under appropriate circumstances and the embodiments of the invention may operate in different sequences than those described or illustrated here.

Moreover, terms such as 'top', 'bottom', 'above', 'below' and so forth in the description and in the claims have been used for descriptive purposes and do not necessarily indicate the relative positioning. The terms used in this way are mutually interchangeable under appropriate circumstances and the embodiments of the invention may operate in different orientations than those described or illustrated here.

The term 'comprising' and similarly derived terms as used in the claims must not be interpreted as being limited to the means that are then stated; such a term does not exclude other elements or steps. The term should be interpreted as a specification of the stated characteristics, whole numbers, steps or components that are referred to, without also excluding the presence or addition of one or more additional characteristics, whole numbers, steps or components, or groups thereof. The scope of an expression such as 'an apparatus comprising means A and B' is therefore not solely restricted to apparatus comprising purely components A and B. What it does conversely mean for the purposes of the present invention is that A and B are the only relevant components.

In this document, the 'top' or 'upper side' of the at least one solar panel in the context of the present invention means that side which faces the sun when the at least one solar panel is being used.

In this document, the term 'light' in the context of the present invention means electromagnetic radiation, more specifically electromagnetic radiation with frequencies or wavelengths that are in the frequency range or wavelength range within which the at least one solar panel of the solar panel system is provided for the purpose of converting electromagnetic radiation into electricity.

In this document, 'translucent' or 'transparent' in the context of the present invention means allowing a large proportion of the incident light to pass through.

FIG. 1 shows a schematic representation of a solar panel system (1) according to one embodiment of the present invention. For the sake of simplicity, this example embodiment only shows a single solar panel (2).

The solar panel (2) is on the upper side of a translucent plate (16). This translucent plate (16) has an electrically conductive layer (17), which in this embodiment is connected electrically to a supporting structure (6) within which the solar panel (2) is mounted. The translucent plate (16) and the electrically conductive layer (17) can be seen in FIGS. 2 to 5. The electrically conductive layer (17) is used for applying an electric potential to the supporting structure (6) and thereby also to the electrically conductive layer (17) with the aim of regeneration and/or prevention of defects in the solar panel, the said potential being uniformly distributed over the upper side of the solar panel (2). It should be noted here that the supporting structure (6) is not required for applying an electric potential to the electrically conductive layer (17), but that the solar panel system (1) can also be made such that the electric potential may be applied directly to the electrically conductive layer (17).

The solar panel (2) also comprises nine photovoltaic cells (3) that are connected together electrically. The solar panel (2) also has connectors for the negative terminal (4) and the positive terminal (5) of the solar panel (2). The solar panel (2) is connected up electrically to a converter (13), which is then connected up to the mains electricity (12).

The solar panel system also comprises an apparatus (8) for detection, regeneration and/or prevention of defects in the solar panels (2) of a solar panel system (1). In this embodiment, the said apparatus (8) is located on the electrical connection between the solar panel (2) and the converter (13), and is therefore placed in series with the converter (13). It should be noted that in another embodiment of the invention, an apparatus for regeneration and/or prevention of defects in solar panels (2) can be provided in the solar panel system (1) in another way, such as for example connected in parallel with the converter (13).

The apparatus (8) comprises a voltage source (7), a power meter (11), a control unit (15), a switching circuit (9) for making and breaking the electrical connection between the solar panel (2) and the voltage source (7), a switching circuit (14) for making and breaking the electrical connection between the solar panel (2) and the converter (13) and thereby to the mains electricity (12), and a switching circuit (10) for making and breaking an electrical connection between the supporting structure (6) and the voltage source (7).

One terminal of the voltage source (7) is connected up electrically to the switching circuit (9) for making and breaking the electrical connection between the solar panel (2) and the voltage source (7). The power meter (11) for measuring the power drawn by the solar panel (2) from the voltage source (7) is also located on this electrical connection. The switching circuit (9) for making and breaking the electrical connection between the solar panel (2) and the voltage source (7) is also connected electrically to both the negative terminal (4) and the positive terminal (5) of the solar panel (2). This switching circuit (9) can be made such that the voltage source (7) can be connected electrically to the negative terminal (4) of the solar panel (2), the positive terminal (5) of the solar panel (2) and the short-circuited combination of negative terminal (4) and positive terminal (5) of the solar panel (2). Another terminal of the voltage source (7) is connected up electrically to the supporting structure (6) within which the solar panel (2) has been mounted. This electrical connection is also where the switching circuit (10) for making and breaking the electrical connection between the supporting structure (6) and the voltage source (7) is located. The switching circuit (14) for making and breaking the electrical connection between the solar panel (2) and the converter (13) and thence the mains electricity grid (12) has been located in this example embodiment on the electrical connection between the converter (13) and the switching circuit (9) for making and breaking the electrical connection between the solar panel (2) and the voltage source (7). The control unit (15) in the example embodiment communicates with all other parts of the apparatus (8) and its purpose is to control these components using the method according to one embodiment of the present invention is for regeneration and/or prevention of defects in the solar panels (2) of a solar panel system (1).

Figures 2, 3:
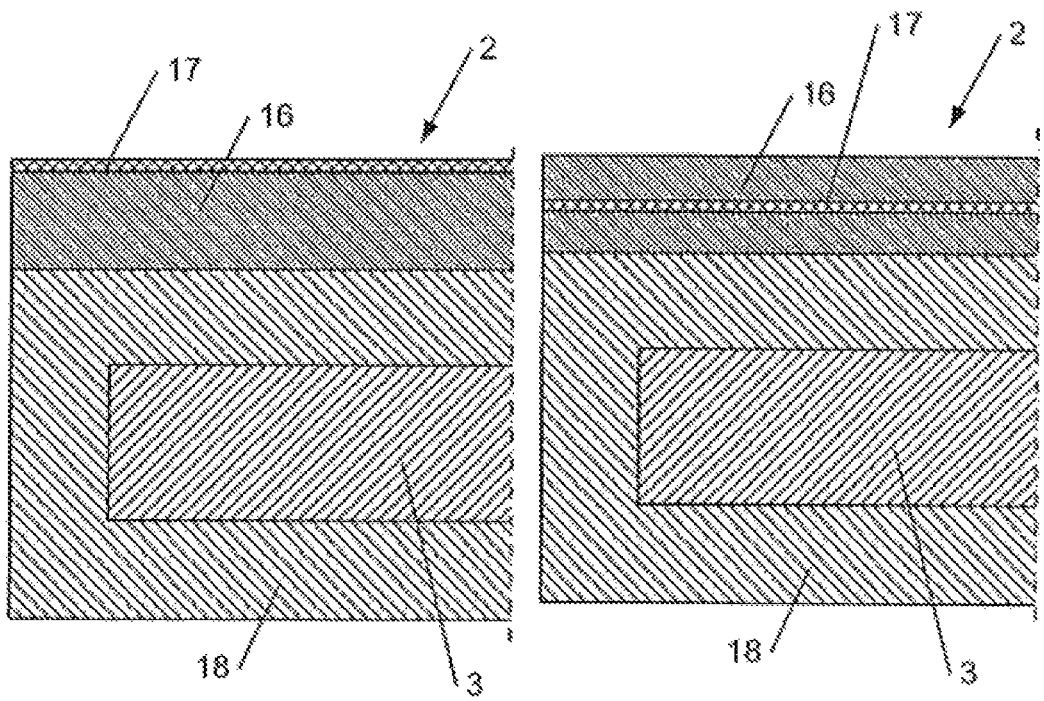
FIG. 2 shows a cross-section through a solar panel system according to one embodiment of the present invention.
FIG. 3 shows a cross-section through a solar panel system according to one embodiment of the present invention.
Figures 4, 5:
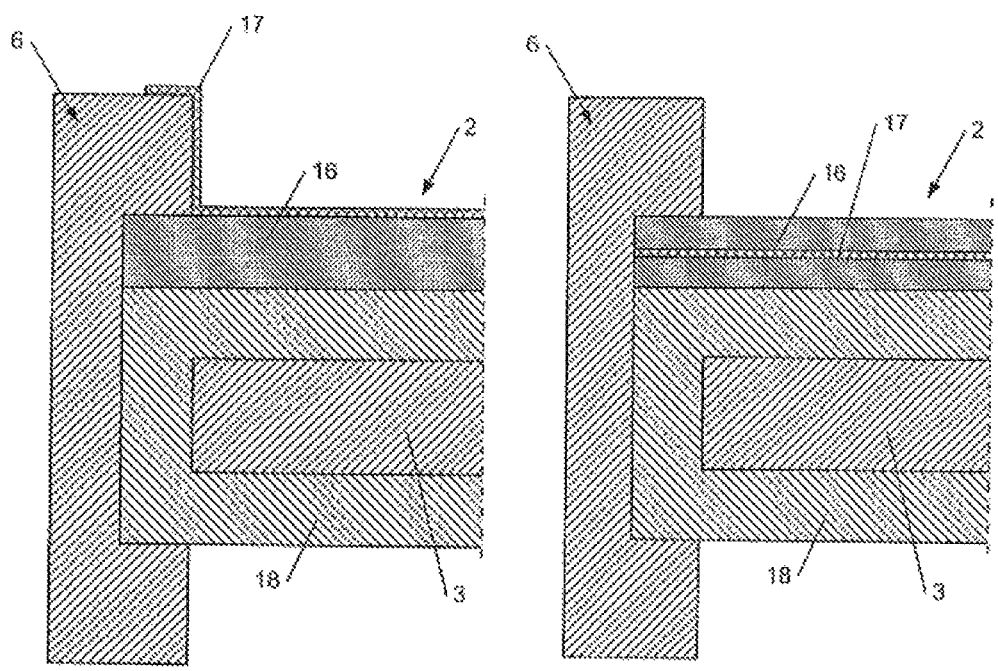
FIG. 4 shows a cross-section through a solar panel system fitted in a supporting structure according to one embodiment of the present invention.
FIG. 5 shows a cross-section through a solar panel system fitted in a supporting structure according to one embodiment of the present invention.

FIGS. 2 to 5 show cross-sections through a solar panel system (1) according to one embodiment of the present invention. In the embodiments of FIG. 2 and FIG. 4, the electrically conductive layer (17) has been applied on top of the translucent plate (16), and in the embodiments of FIG. 3 and FIG. 5, the electrically conductive layer (17) has been included within the translucent plate (16). It should be noted in these figures that the figures show a simplified representation and that not all components are therefore shown in full detail and that some components may even have been left out altogether.

FIGS. 4 and 5 show a solar panel (2) that has been fitted at the side into an electrically conductive supporting structure (6), and FIGS. 2 and 3 show a solar panel (2) without a supporting structure (6). The solar panel (2) comprises at least one photovoltaic cell (3) that is surrounded by a casing (18) that is an electrical isolator. The photovoltaic cells (3) are normally constructed from a combination of positively doped (p) semiconductors and negatively doped (n) semiconductors between which a p-n junction forms. In the simplest configuration, a single p-n junction is thus formed for example between a layer of a p-doped semiconductor and a layer of an n-doped semiconductor. The photovoltaic cells (3) normally also have electrically conductive contacts or connection points to allow electrical connections to be made to the photovoltaic cells (3). The casing (18) normally comprises a supporting plate that can be made of a plastic such as e.g. polyvinyl fluoride (PVF), with a protecting film around the photovoltaic cells (3), where the said protective film can be made of a plastic such as e.g. ethylene vinyl acetate (EVA). Furthermore, an anti-reflective covering layer may be applied on the photovoltaic cells (3).

The upper side of the solar panel (2) has a translucent plate (16) that can for example be made of glass or a transparent plastic. The translucent plate (16) has an electrically conductive layer (17); in FIGS. 4 and 5, the electrically conductive layer (17) is connected electrically to the supporting structure (6) in which the solar panel (2) has been mounted. The electrically conductive layer (17) should preferably not be located on the underside of the translucent plate (16) in order to isolate the electrically conductive layer (17) as well as possible electrically from the photovoltaic cells (3). In FIGS. 2 and 3, the electrically conductive layer (17) can for instance have connectors for making an electrical connection to a means of supplying an electric potential, such as e.g. a voltage source or the earth. In the embodiment of FIG. 4, the electrically conductive layer (17) has been applied on top of the translucent plate (16) and the electrically conductive layer (17) is made to create an electrical contact with the supporting structure (6) by having the electrically conductive layer (17) continue onto a part of the supporting structure (6). In the embodiment of FIG. 5, the electrically conductive layer (17) is included in the translucent plate (16) and the electrically conductive layer (17) makes an electrical connection with the supporting structure (6) because the electrically conductive layer (17) protrudes through the translucent plate (16) at the sides and is in contact with the supporting structure (6) there. An electric potential can thus be applied to the electrically conductive layer (17) in FIGS. 4 and 5 by applying an electric potential to the supporting structure (6).

LIST OF REFERENCE NUMBERS 1 solar panel system
2 solar panel
3 photovoltaic cell
4 negative terminal of the solar panel
5 positive terminal of the solar panel
6 supporting structure
7 voltage source
8 system
9 switching circuit between voltage source and solar panel
10 switching circuit between the voltage source and the supporting structure
11 power meter
12 mains electricity
13 converter
14 switching circuit between the solar panel and the electricity mains
15 control unit
16 translucent plate
17 electrically conductive layer
18 casing of the photovoltaic cell

The invention claimed is:

1. A solar panel installation, comprising at least one solar panel comprising one photovoltaic cell or a plurality of electrically connected photovoltaic cells, wherein the at least one solar panel comprises a translucent plate that is provided on the upper side of the at least one solar panel and that protects the one photovoltaic cell or the plurality of electrically connected photovoltaic cells, wherein the translucent plate of the at least one solar panel is provided with an electrically conductive layer that is electrically isolated from the one photovoltaic cell or the plurality of electrically connected photovoltaic cells by the translucent plate, and the electrically conductive layer includes an electrically conductive film that covers an entire top surface of the translucent plate and the electrically conductive layer uniformly distributes an electric potential over the upper side of the at least one solar panel as the electric potential is applied to the electrically conductive layer, wherein the electrically conductive layer is transparent to light, and wherein the solar panel installation further comprises at least one electrically conductive supporting structure in which the at least one solar panel is mounted, wherein the electrically conductive layer is connected electrically to the at least one supporting structure such that an electric potential can be applied to the electrically conductive layer by applying an electric potential to the at least one supporting structure.

2. The solar panel installation according to claim 1, wherein the electrically conductive layer is applied such that it is removable from the top of the translucent plate.

3. The solar panel installation according to claim 1, wherein the translucent plate is provided with the electrically conductive layer by spraying an electrically conductive liquid material onto the top surface of the translucent plate.

4. The solar panel installation according to claim 3, wherein the electrically conductive liquid material is arranged to cure or harden after being sprayed onto the top surface of the translucent plate.

5. The solar panel installation according to claim 3, wherein the electrically conductive liquid material is arranged to adhere to the top surface of the translucent plate in liquid form.

6. The solar panel installation according to claim 1, wherein the translucent plate comprises glass.

7. The solar panel installation according to claim 1, wherein the solar panel installation comprises an apparatus that regenerates or prevents defects in the at least one solar panel of the solar panel installation, wherein the apparatus comprises:

at least one voltage source that applies a predefined regeneration voltage between the at least one solar panel and the electrically conductive layer or the at least one supporting structure, a first switching circuit for making or breaking an electrical connection between a first terminal of the at least one voltage source and the electrically conductive layer or the at least one supporting structure, a second switching circuit for making or breaking an electrical connection between a second terminal of the at least one voltage source and at least one of the negative and positive terminals of the at least one solar panel.

8. The solar panel installation according to claim 7, wherein the apparatus also comprises at least one power meter that measures the power that is drawn by the at least one solar panel from the at least one voltage source and that is electrically connected to and located between the at least one solar panel and the at least one voltage source.

9. The solar panel installation according to claim 8, wherein at least one control unit is also linked to the at least one power meter.

10. The solar panel installation according to claim 7, wherein the solar panel installation also comprises an electrical connection between the at least one solar panel and an electricity main, and where the apparatus also comprises a third switching circuit for making and breaking an electrical connection between the terminals of the at least one solar panel and the electricity main.

11. The solar panel installation according to claim 7, wherein the apparatus also comprises at least one control unit that controls the apparatus, wherein the at least one control unit is linked to the at least one voltage source and the first and second switching circuits for making and breaking the electrical connections.

12. The solar panel installation according to claim 11, wherein the at least one control unit is also linked to at least one power meter.

13. The solar panel installation according to claim 7, wherein the apparatus also comprises at least one power meter that measures the power that is drawn by the at least one solar panel from the at least one voltage source and that is electrically connected to and located between the at least one solar panel and the at least one voltage source, and wherein the apparatus further detects defects in the at least one solar panel of the solar panel installation.

* * * * *